United States Patent [19]

Paulson

[11] 4,307,335

[45] Dec. 22, 1981

[54] OPEN THERMOCOUPLE TESTER SYSTEM

[75] Inventor: Albert M. Paulson, Eatontown, N.J.

[73] Assignee: Electronic Associates, Inc., West Long Branch, N.J.

[21] Appl. No.: 87,882

[22] Filed: Oct. 24, 1979

[51] Int. Cl.³ .................... G01R 31/02; G08B 29/00
[52] U.S. Cl. ................................. 324/51; 324/73 R; 340/514; 340/652
[58] Field of Search .............. 324/51, 73 AT, 73 R, 324/111; 340/506, 512, 514, 595, 652; 73/1 F

[56] References Cited

U.S. PATENT DOCUMENTS

| | | | |
|---|---|---|---|
| 2,937,369 | 5/1960 | Newbold et al. | 324/111 X |
| 3,582,926 | 6/1971 | Hassan | 340/595 X |
| 3,590,370 | 6/1971 | Fleischer | 324/51 |
| 3,760,265 | 9/1973 | Hutch | 340/652 X |
| 3,973,184 | 8/1976 | Raber | 324/51 |
| 4,155,080 | 5/1979 | Kovacs | 324/51 X |
| 4,166,243 | 8/1979 | West et al. | 324/51 |

Primary Examiner—Gerard R. Strecker
Attorney, Agent, or Firm—Allan Ratner

[57] ABSTRACT

A system for testing open thermocouples in a data acquisition system in which each of a plurality of thermocouples is sequentially read. Each thermocouple has an associated filter capacitor and resistance network and each has a different common-mode voltage with respect to a reference potential. Charging means is effective to charge each filter capacitor in sequence after a reading has been taken. For a normal thermocouple, the filter capacitor discharges through the associated resistance and thermocouple prior to the next sequential reading of that thermocouple. For an open thermocouple the filter capacitor remains charged indicating that the thermocouple is open at the time of the next sequential reading of that thermocouple.

6 Claims, 15 Drawing Figures

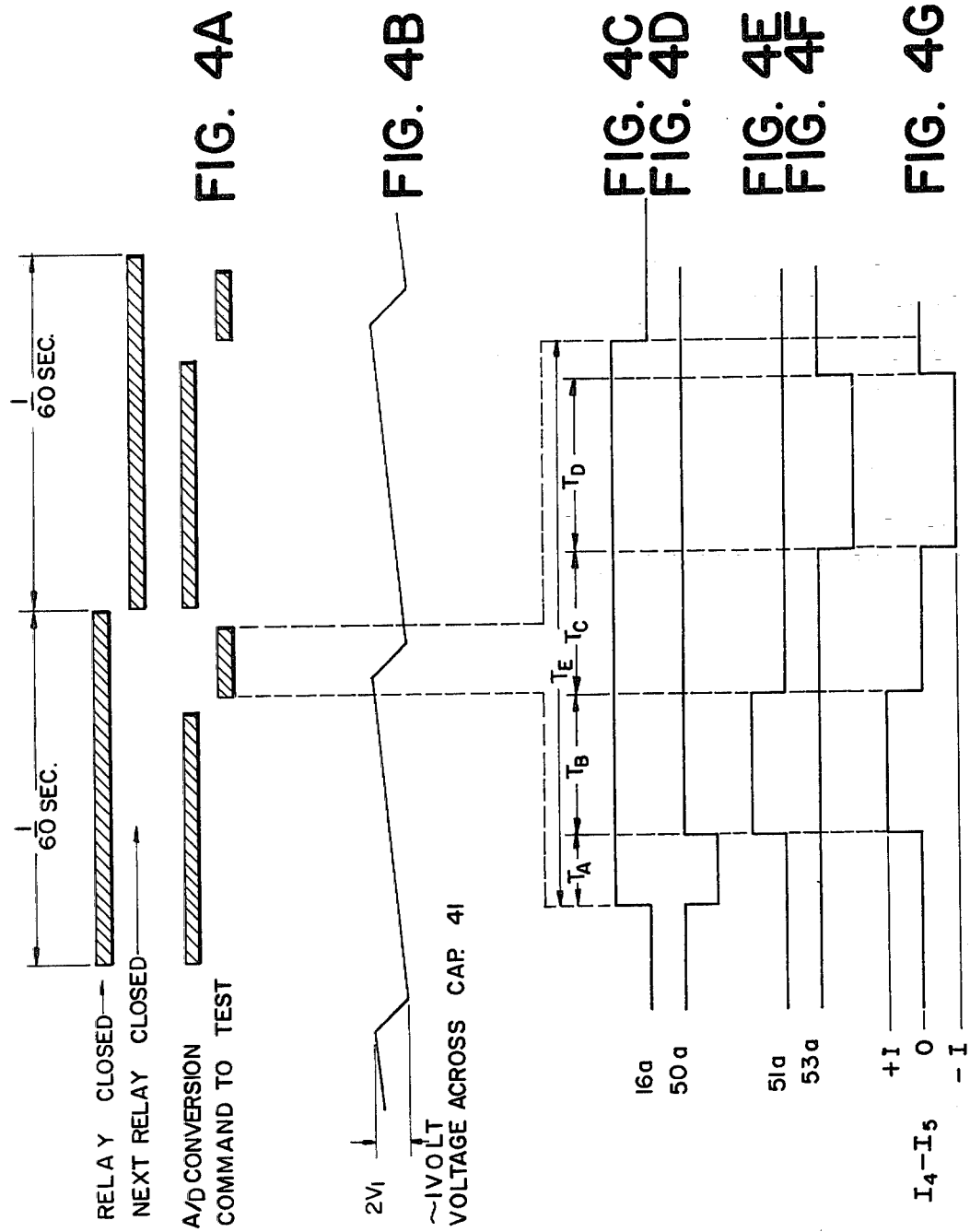

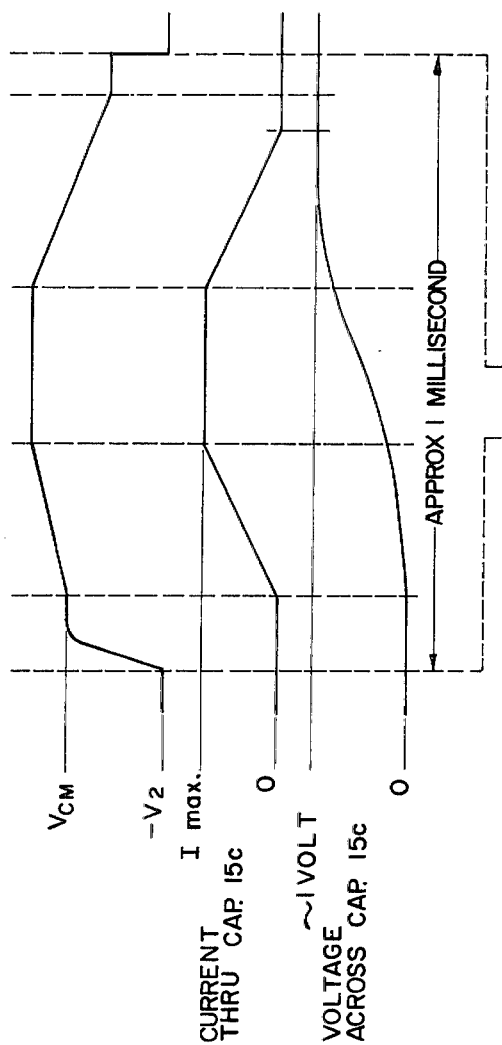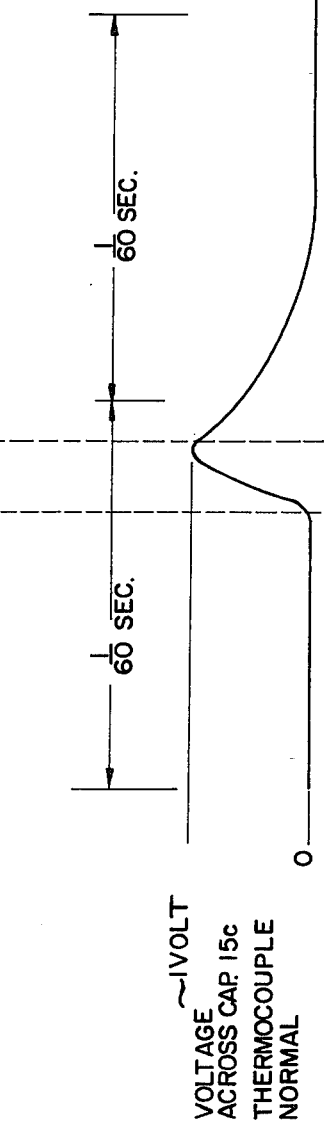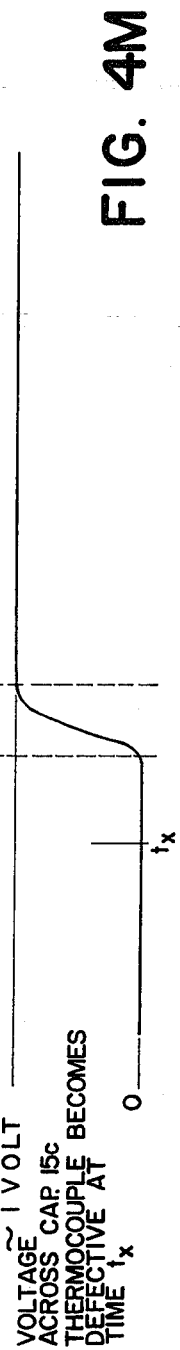

OPEN THERMOCOUPLE TESTER SYSTEM

BACKGROUND OF THE INVENTION

A. Field of the Invention

This invention relates to the field of automatic acquisition of data from a plurality of thermocouples.

B. Prior Art

Known data acquisition systems have many thermocouples located at various points in, for example, power generating stations and chemical processing plants. The thermocouples are continuously monitored and data from each are recorded at desired intervals. Thermocouples having dissimilar metals bonded together commonly fail by becoming open circuited. Since the output of a normal thermocouple junction is a very small voltage value corresponding to the temperature difference with respect to a reference junction the output from a failed device would be indistinguishable from that of a normal device, especially since an open circuit at the input of an instrumentation amplifier would permit small offset and leakage currents to provide a small random voltage difference.

In some prior systems, thermocouples have been tested for an open condition by connecting them to a current source and measuring the resultant current flow or voltage drop. One such method which has been used successfully involves the addition of a common dry cell battery to each thermocouple circuit so a micro-ampere of current continuously flows through the thermocouple producing a negligible voltage drop if it is normal, but creating a terminal voltage of about one volt if it were open. The disadvantage of course is the need to replace, annually at least, hundreds of batteries in a typical multipoint system. Equivalent systems have previously been used in which the test current is provided by an instrumentation power source in lieu of batteries. Such prior systems however have introduced other drawbacks such as some cross-coupling of signals or the creation of error voltages by the flow of current in the test circuit due to the common-mode voltage present at the thermocouple.

In other data acquisition systems, each of the multitude of thermocouples, has an associated pair or resistors and a shunt capacitor designed to attenuate normal mode noise at the input to the amplifier. These filter components render ineffective testing means which introduce from the amplifier end, brief current pulses to the thermocouple loop because such pulses would be bypassed by the filter capacitor regardless of the state of the thermocouple. Furthermore, since the data acquisition system comprises assemblies of thermocouple filters and relays, connection could not be established directly to the thermocouple beyond the resistors for the purpose of detecting abnormal voltage without incurring the great expense of adding relays for each thermocouple point.

Accordingly, an object of this invention is to provide means for quickly charging the filter capacitor associated with each thermocouple to a recognizably high voltage and isolating such circuit from all other circuits in the system during this event. This voltage will remain on the capacitor if the associated thermocouple is open circuited and will give an indication of an open thermocouple.

A further object of this invention is to control the rates at which said charging current is turned on and off to minimize or eliminate errors caused by inductive coupling with other circuits.

SUMMARY OF THE INVENTION

An open thermocouple tester system in a data acquisition system in which a plurality of thermocouples is sequentially read. Each of the thermocouples has an associated filter capacitor and resistance network and each has a different common-mode voltage with respect to a reference potential. Means is provided for charging each filter capacitor after a reading has been taken. Accordingly, if a thermocouple is normal, the filter capacitor discharges through the associated resistance and thermocouple prior to the next sequential reading of the thermocouple. However, if the thermocouple is open, the filter capacitor remains charged indicating that the thermocouple is open at the time of the next sequential reading of that thermocouple. There is further provided means for isolating the charging means from the reference potential so that the charging means floats to the common-mode voltage of a respective filter capacitor during the time of its charging by the charging means.

BRIEF DESCRIPTION OF THE DRAWINGS

FIGS. 4A-4M are timing and waveform diagrams which show operation of the invention during a measurement and test cycle.

DETAILED DESCRIPTION

Figure 1:
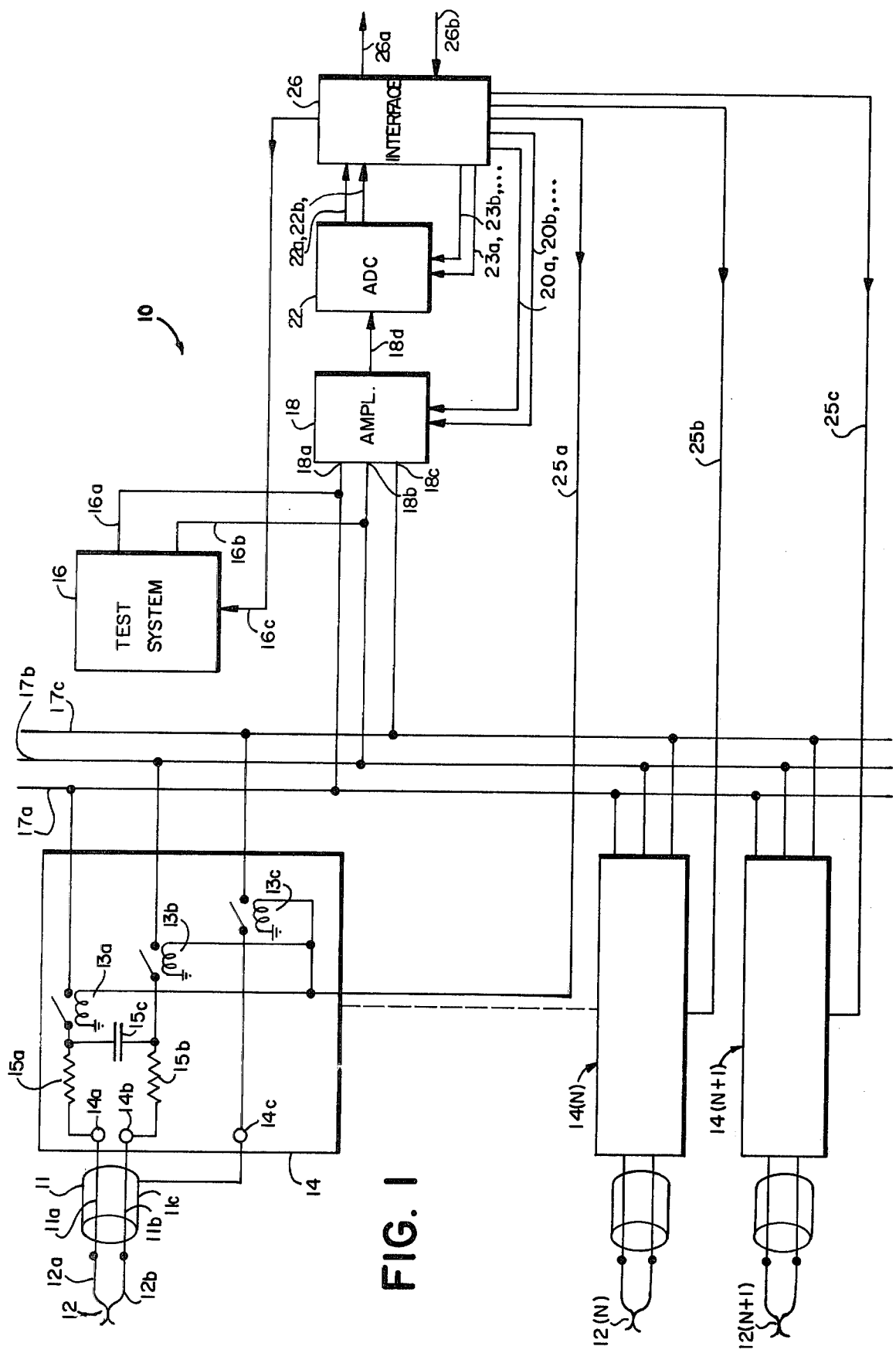
FIG. 1 is a block diagram showing a thermocouple data acquisition system and an open thermocouple tester embodying the present invention.

Referring now to FIG. 1 there is shown a thermocouple data acquisition system 10 comprising a plurality of thermocouples 12, a like plurality of thermocouple filter-relay sets 14, an instrument amplifier 18, analog-to-digital converter 22 and system control/computer interface unit 26. Unit 26 interfaces with a data acquisition computer (not shown) system such as a PROPACE System PR250 and software made by Electronic Associates, Inc., West Long Branch, NJ. An open thermocouple tester system 16 is effective to charge a filter capacitor associated with each thermocouple with brief pulse of large current while the particular selection relay is closed but with the amplifier input disconnected.

If the thermocouple were normal it would establish a current path to allow quick discharge of the capacitor after the selection relay is opened. On the other hand, if the thermocouple were open, the capacitor would remain charged. The voltage on the capacitor would be much higher than the output of a normal thermocouple (even at elevated temperatures) and would be an indication of an open thermocouple when that thermocouple is once again selected and connected to the amplifier input. The charging current source is disconnected (caused to float) from system grounds during the charging process to alleviate perturbations.

Although it is sufficient to describe the details of just one thermocouple point in the plurality of thermocouples, two additional thermocouples 12(N) and 12(N+1) and associated filter relay rests 14(N) and 14(N+1) are shown in dashed outline in FIG. 1.

Thermocouple 12 is the spatially brief junction of two wires 12a and 12b of dissimilar metals. The thermocouple is connected to the measurement system by a cable 11 which comprises a pair of conductors 11a and 11b surrounded by an electrostatic shield 11c. This cable is terminated at the filter-relay set 14 at points 14a, 14b and 14c. A low-pass filter including capacitor 15c and resistors 15a, 15b is connected between points 14a, 14b and relays 13a, 13b and serves to attenuate rapid fluctuations in the EMF developed by the thermocouple which may be introduced by vibration and induction of normal-mode noise currents in the thermocouple loop. The voltage which exists across capacitor 15c is in the order of millivolts but is a function of temperature at the thermocouple junction 12. In this embodiment of the invention, resistors 15a and 15b each may be approximately 500 ohms and capacitor 15c may be approximately 300 microfarads. These parameters however can be established anywhere within a wide range.

The cable shield 11c is connected at point 14c to a third relay 13c and the mating contacts of relays 13a, 13b, 13c are connected via bus conductors 17a, 17b, 17c to the instrument amplifier 18. Other thermocouples are connected to the bus conductors via identical filters and relays such as 12(N), 14(N), 12(N+1), 14(N+1). The total number may well exceed one thousand. It is important to note that no more than one thermocouple will be engaged with the bus by its relay at any instant. Bus conductors 17a, 17b connect to points 18a, 18b which are the differential inputs of the instrument amplifier 18. Bus conductor 17c is connected to point 18c which provides adequate ground for noise currents electrostatically coupled to the shield 11c of the connected thermocouple cable 11.

The voltage difference between input points 18a, 18b is amplified to analog-to-digital converter 22 which produces on a set of parallel bit lines 22a, 22b, etc. a binary digital representation of the applied voltage. This data is supplied in turn to system control/computer interface 26 which forwards it to a computer after appropriately formatting it. The system control addresses each of the multitude of thermocouple relays in a predetermined sequence by commands on lines 25a, 25b, 25c, etc. Their contacts close to engage each thermocouple with the amplifier input bus for a short period. The system control also provides timing commands to the converter 22 via lines 22a, 22b, etc. and controls the gain of amplifier 18 by means of digital data applied on lines 20a, 20b, etc.

The system of FIG. 1 is capable of scanning up to 1,024 thermocouples in a little over a minute. Each thermocouple is read four times, each reading being done in 1/60th of a second. During each reading a thermocouple is engaged to the amplifier, the amplifier output is digitized and the resulting data is processed and recorded. During each reading period and following the digital conversion of the amplifier output, a command is issued to the open thermocouple tester system 16 via line 16c from the system controller 26. The tester 16 delivers a brief and controlled pulse of current via lines 16a, 16b, bus conductors 17a, 17b and closed contacts of relays 13a, 13b to the filter capacitor 15c. This pulse, which has an amplitude of about one ampere and a duration of about half a millisecond, is effective to place a one volt charge on capacitor 15c. As will be shown, the rising and falling edges of the current pulse are controlled so as to minimize induced transients in the other circuits. A relatively negligible portion of the current is diverted through the resistors 15a, 15b and thermocouple 12 during the pulse period, so that the charge on the capacitor 15c immediately following the pulse is not affected significantly by the thermocouple condition; whether open circuited or normal. As shown in FIG. 4K the capacitor 15c starts to charge immediately, however, through the resistors 15a, 15b and thermocouple 12 if the latter is normal and after a few milliseconds no voltage other than that produced by the thermocouple junction remains on the capacitor as shown in FIG. 4L. If, on the other hand, the thermocouple is open the charge remains on the capacitor 15c and on the next scan cycle this voltage is presented to the input of amplifier 18 when the contacts of relays 13a, 13b close as illustrated in FIG. 4M. Since such a voltage is beyond the range of any normal thermocouple, the amplifier 18 and converter 22 are saturated. This saturated condition is recognized by system controller 26 and a notation of an open thermocouple is stored in the data records for the point in lieu of data.

Figure 2:
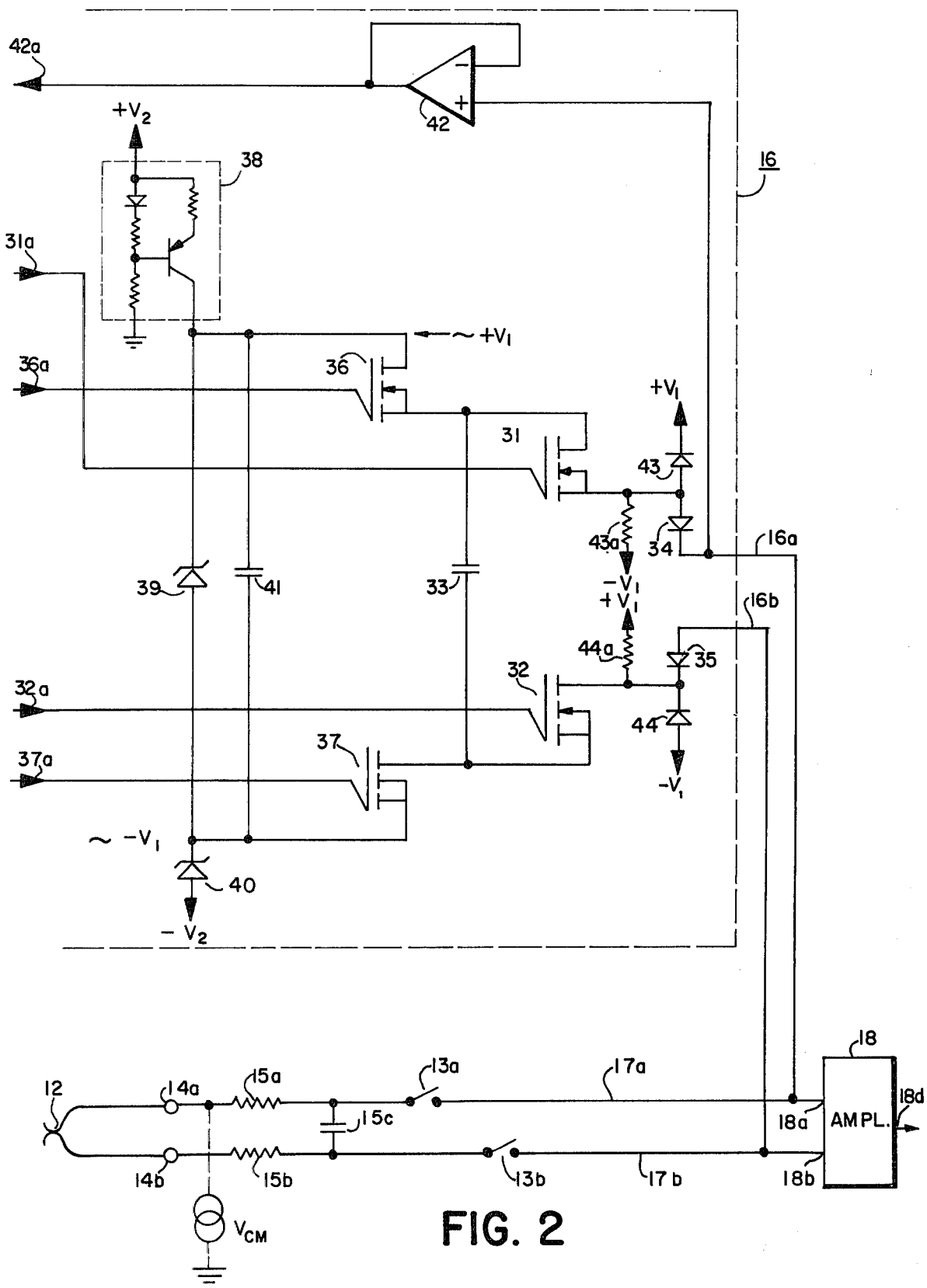
FIG. 2 is a schematic diagram illustrating the portion of the open thermocouple tester of FIG. 1 which transfers charge from a charged capacitor to the filter capacitor associated with a particular thermocouple and provides for replenishment of charge on the first capacitor.

Details of tester system 16 are shown in FIG. 2 which schematically illustrates that part of the tester system 16 which transfers charge from a storage capacitor to the thermocouple filter capacitor and replenishes the stored charge. In FIG. 2 four P-type metal-oxide-substrate field-effect transistors (VMOSFETs) 31, 32, 36, 37 function as switches. When the gate voltage is at least several volts more negative than the drain voltage, a very high resistance is maintained between the source and drain. When the gate voltage is at least several volts more positive than the source voltage, the resistance between source and drain is in the order of one ohm which is a very low resistance in the context of this circuit. When the gate voltage is slightly more positive than the source, the source-to-drain conductance is essentially proportional to the gate-to-source voltage. As will be shown, transistor 31 operates as a variable conductance element.

During the times when the tester system 16 is not active, transistors 31 and 32 are biased off and MOSFETs 36 and 37 are biased on. This allows current to flow from a constant current stage 38 (which comprises a PNP transistor biased for constant emitter current) through storage capacitor 33 via transistors 36 and 37 and a Zener diode 40. Current, of course, only flows through capacitor 33 while it is charging. When the voltage on this capacitor reaches the breakdown voltage of Zener diode 39 current stops flowing through 33 and flows through 39 instead. Thus the capacitor 33 remains charged to a voltage equal to the breakdown voltage of Zener diode 39. This voltage is approximately equal to $2V_1$ where $V_1$ is the magnitude of the positive and negative clamping voltages which will later be discussed.

When a thermocouple 12 is selected for measurement, relays 13a and 13b complete the connection to the amplifier 18 and tester system 16. The transistors remain in the aforementioned states during this time. A very high impedance—higher than that achievable by the off-biased transistors alone—is maintained between terminals 16a and 16b of the tester system 16 by diodes 34 and 35 which are reverse biased by their connection to the negative and positive clamping voltages $-V_1$ and $+V_2$ respectively via resistors 43a and 44a.

Following conversion of the thermocouple voltage to digital data a test command is initiated by the system controller. As will be explained further, transistors 36 and 37 are immediately turned off and transistor 32 is turned on. The conductance of transistor 31 increases in a controlled manner during a short interval from zero to a value high enough to permit about one ampere to flow from capacitor 33 (which is charged to a voltage of $2V_1$) through transistor 31 and diode 34 to the thermocouple filter capacitor 15c, returning via diode 35 and transistor 32. The conductance of transistor 31 is held at this peak value for another short interval after which its conductance decreases in a controlled manner to zero during a third short interval. The charge thus delivered to capacitor 15c causes approximately one volt to be present at its terminals immediately following said third interval.

It will be understood that to accomplish charging of capacitor 15c it would suffice to just turn both transistors 31 and 32 fully on for a brief period to permit a one-volt charge to build up on capacitor 15c. However, the sudden turn-on and turn-off of current would induce transient disturbances in other circuits by virtue of mutual inductive coupling between them and would cause errors and malfunctions in other portions of the system.

In order to minimize such disturbances the conductivity of transistor 31 is increased in a more or less linear fashion with time from zero to the aforestated maximum value; held at that value and then decreased linearly to zero again. In the specific embodiment of the invention, the conductivity rises in approximately 200 microseconds; is held at the maximum value for about another 200 microseconds and then falls back to zero during another 200 microseconds.

The duration and amplitude of the current pulse can have values different from the particular ones cited in the specific embodiment. The current amplitude must be significantly larger than the current that would be bypassed by a normal thermocouple and large enough to charge the capacitor within the allotted time, but not so large that the transistor would be damaged. The duration must be brief enough to accomplish charging within the established thermocouple read cycle but still long enough to allow charging with a reasonable current amplitude.

It is also important to note that transistors 36 and 37 in their off states maintain complete isolation of the thermocouple 12 and its filter capacitor 15c from any other ground-referenced circuitry during this charging operation so that no disturbance to or by the thermocouple common-mode voltage present on the thermocouple circuit occurs. The common-mode voltage is represented symbolically in FIG. 2 by a voltage generator labeled $V_{cm}$ referenced to ground and connected to point 14a of the thermocouple filter.

An operational amplifier 42 configured as a voltage follower creates a DC voltage on line 42a with respect to circuit ground which is equal to the thermocouple common-mode voltage on line 16a. Since the operational amplifier in this mode has a very high input impedance, this allows the common-mode voltage to control other circuits as will be shown without being affected by them. The gates of the four transistors 31, 32, 36 and 37 are extended on lines 31a, 32a, 36a and 37a.

Figure 3:
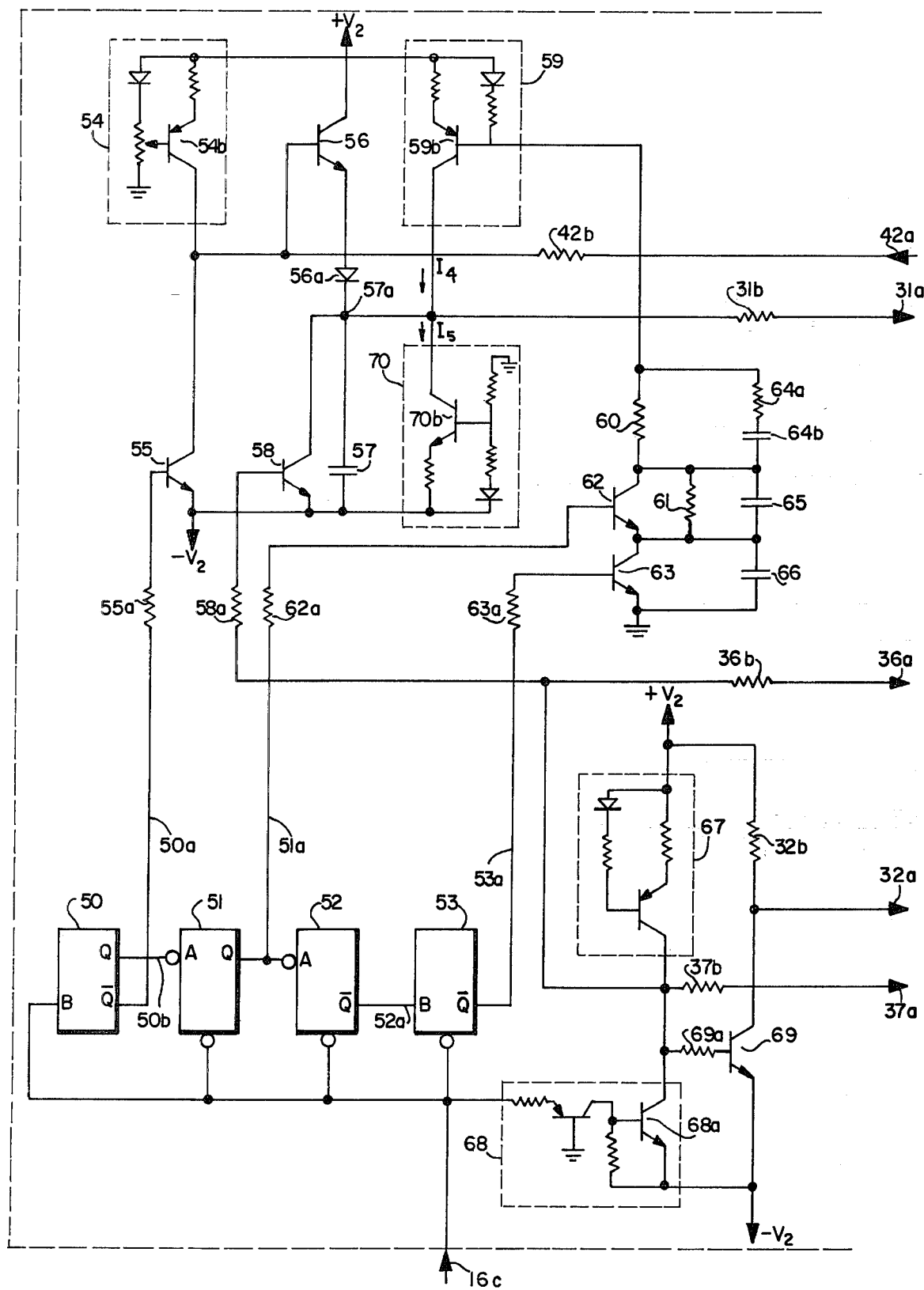
FIG. 3 is a schematic diagram which illustrates portions of the open thermocouple tester not included in FIG. 2. The portions illustrated in this figure control the conductance and duration of the charge transfer path illustrated in the previous figure.

FIG. 3 shows the remainder of the circuits within system 16 and FIG. 4 shows waveforms of various points. A command-to-test logic voltage is placed on lines 16c for an interval $T_E$ (FIG. 4C) shortly after completion of the digital conversion of the thermocouple voltage which was explained previously. $T_e$ in this embodiment is equal to approximately one millisecond. There are four monostable multivibrators 50, 51, 52 and 53 connected in cascade. The durations of the pulses formed by these elements are controlled by resistors and capacitors which are not shown in FIG. 3, but implied by the symbols. The rising edge of the voltage on line 16c turns on monostable 50 causing the voltage at line 50b to go high for a short interval $T_A$ (approximately 10 microseconds). The voltage at line 50a goes low for the same period (FIG. 4D). When voltage at line 50b falls it triggers monostable 51 whose output at line 51a goes high for an interval $T_B$ (FIG. 4C). $T_B$ is equal to approximately 200 microseconds. When this latter voltage falls monostable 52 is triggered on causing the voltage on line 52a to go low for an interval $T_C$. $T_C$ is also approximately 200 microseconds. When that voltage rises it triggers monostable 53 causing its voltage to go low for an interval $T_D$ (FIG. 4F) and then return high. $T_D$ is approximately 400 microseconds. When the voltage at line 16c goes low again it resets monostables 51, 52 and 53 to guarantee that their initial states will be correct for the next cycle.

The voltage on line 16c is also applied to a voltage level translator 68 so that transistor 68a conducts when line 16c is at a high logic level and is turned off when the logic level is low. A constant current stage 67 supplies current from the $+V_2$ supply voltage bus to the gates of transistors 36 and 37 via resistors 36b and 37b when transistor 68a is turned off. Current is also supplied to the base of transistor 69 via resistor 69a and to the base of transistor 58 via resistor 58a. Thus when the logic level of line 16c is low transistors 36 and 37 and transistors 58 and 59 are turned on. Transistor 69 clamps line 32a to the $-V_2$ supply voltage bus turning off transistor 32. When the logic level on line 16c goes high transistors 36 and 37 and transistors 58 and 59 are turned off. When transistor 69 is turned off transistor 32 is turned on fully by the current through resistor 32 from the $+V_2$ supply voltage bus.

As explained previously, transistor 58 is turned on while line 16c is low clamping terminal 57a of capacitor 57 to the $-V_2$ supply bus. When line 16c is high capacitor 57 is allowed to receive current from other stages. During interval $T_A$ transistor 55 is turned off by the low voltage at output 50a of monostable stage 50. This allows the output voltage on line 42a from amplifier 42 to be placed on the base of transistor 56. Transistor 56 functions as an emitter follower which charges capacitor 57 to this base voltage less the base-emitter forward voltage drop and the voltage drop in diode 56a during interval $T_A$. The voltage at terminal 57a of capacitor 57 is extended to the gate of transistor 31 by way of resistor 31b. Current from source 54 causes an additional voltage drop on resistor 42b which is added to the voltage at 42a to compensate for voltage drops across the base-emitter junction of transistor 56 and diode 56a and allows transistor 31 to be adjusted to the threshold of gate-voltage controlled conduction. Thus at the end of interval $T_A$ the gate voltage on transistor 31 is equal to its source voltage regardless of the value of the common-mode voltage present on line 16a.

At the end of the initial interval $T_A$ transistor 55 is turned on again, inversely biasing emitter follower 56 and diode 56a so that no current can flow from 56 to capacitor 57. At this time transistor 62 is turned on by the positive voltage from monostable 51. Since transistor 63 is already on by virtue of the positive voltage from monostable 53, current flows from the base of the transistor 59b of current source stage 59 to ground by way of resistor 60. This causes a current $I_4$ to flow from the collector of transistor 59b into capacitor 57.

Offsetting current $I_4$, is a constant current $I_5$ which flows from capacitor 57 into the collector of transistor 70a of constant current stage 70. Current $I_4$ at this time is approximately twice the magnitude of current $I_5$ so that a net current flows into capacitor 57 that is equal approximately to $I_5$. Accordingly, the voltage at terminal 57a increases linearly with time. At the end of interval $T_B$ transistor 62 is turned off causing current from the base of transistor 59b to flow through both resistors 60 and 61. This causes a reduction in magnitude of the current $I_4$ and the resistors being sized so that the current is now equal to rather than twice the magnitude of the current $I_5$ causing the net current into capacitor 57 to be zero. As a result the voltage at terminal 57a remains constant during interval $T_C$. Following this interval transistor 63 is turned off by the low-going voltage at the output 53a of monostable stage 53 which turns off base current from transistor 59b and thus turns off current $I_4$. The remaining current $I_5$ is drawn from capacitor 57 causing the voltage at 57a to decrease in a linear fashion during the interval $T_D$. This interval is long enough to ensure that the voltage at the gate of transistor 31 with respect to its source drops to zero and becomes negative. When the voltage at line 16c goes low transistor 58 is turned on and terminal 57a is clamped to the $-V_2$ voltage bus ensuring turn-off of transistor 31.

The waveform of net current ($I_4$–$I_5$) which flows into the capacitor is shown in FIG. 4G. The waveform of the voltage at terminal 57a of capacitor 57 is shown in FIG. 4H. During the times that the command-to-test is not active, this voltage is clamped to the negative bus voltage $-V_2$. During interval $T_A$ this voltage rises to whatever value the common-mode voltage $V_{CM}$ has during interval $T_A$; increases at a constant rate during interval $T_B$; remains constant during interval $T_D$ falling back to $-V_2$ at the end of the command-to-test pulse. Since, as pointed out previously, the conductivity of transistor 31 is essentially proportional to the gate-to-source voltage the capacitor current waveform of FIG. 4J follows the capacitor voltage waveform except that it rises from and falls to zero during the time the gate-to-source voltage is positive (capacitor voltage exceeds common-mode voltage).

The resulting voltage across capacitor 15c is shown by the waveform of FIG 4K. This voltage is the time integral of the capacitor current and rises monotonically to about one volt during the time that current is flowing into the capacitor. A corresponding drop occurs in the voltage across storage capacitor 41 which is shown on a larger time scale in FIG. 4B. The voltage on capacitor 41 is restored prior to the next command-to-test by the charging circuit explained previously.

FIG. 4L illustrates, on an expanded time scale, the manner in which the voltage applied to capacitor 15c decays by discharge through a normal thermocouple during the period between scans. FIG. 4M illustrates, on the same scale, how the voltage placed on capacitor 15c would remain fully charged if the thermocouple had open-circuited prior to the charging interval as shown. Capacitors 64b, 65 and 66 in conjunction with resistor 64a serve to smooth out otherwise abrupt transitions of current $I_4$ so that there will be no excessive second derivative (with respect to time) of the current conducted by transistor 31 thereby further reducing the possibility of coupling noise to other circuits.

In the illustrated embodiment of the subject invention, the supply voltages $+V_2$ and $-V_2$ may be equal respectively to $+15$ and $-15$ volts. The charging current pulse amplitude is about one ampere and the total duration is about 600 microseconds. The current which restores the charge on storage capacitor 41 may be approximately 51 milliamperes.

What is claimed is:

1. In a data acquisition system for sequentially reading by way of monitor means a plurality of thermocouples each having a permanently coupled filter capacitor and resistance network, an open thermocouple tester system comprising
    floating charge means for sequentially charging each of said filter capacitors,
    switching means for sequentially coupling each of said filter capacitors to said floating charge means and monitor means,
    a source of supply for charging said floating charge means,
    first isolating means for isolating said floating charge means from said switching means and monitor means during a first duration during which said monitor means sequentially reads each of said filter capacitors, whereby (1) for a normal thermocouple said filter capacitor discharges through said thermocouple and (2) for an open thermocouple said filter capacitor remains charged, and,
    second isolating means for isolating said source of supply from said floating charge means for a second duration during which said floating charge means sequentially charges each of said filter capacitors.

2. The system of claim 1 wherein each of said thermocouples has a different common mode voltage with respect to a reference potential and said second isolating means isolates said floating charge means from said reference potential so that said floating charge means floats to the common mode voltage of a respective filter capacitor during said second duration.

3. The system of claim 1 in which said floating charge means includes a charging capacitor.

4. The system of claim 3 in which there is provided time sequencing means for first providing said switching means to sequentially couple said monitor means to each of said filter capacitors for reading each filter capacitor, second actuate said first isolating means to couple said charging capacitor across and charge each of said filter capacitors, third actuate said first isolating means to isolate said floating charge means from said switching means and monitor means, and fourth actuate said second isolating means to charge said charging capacitor.

5. The system of claim 1, 2, 3 or 4 in which said floating charge means includes means for shaping a charging current rate in its rise and fall to minimize inductive coupling between a respective filter capacitor being charged and the remaining filter capacitors.

6. The system of claim 1, 2, 3 or 4 in which said first isolating means includes at least one pair of VMOS transistors.

* * * * *